United States Patent

Kwak

[11] Patent Number: 6,158,036
[45] Date of Patent: Dec. 5, 2000

[54] MERGED MEMORY AND LOGIC (MML) INTEGRATED CIRCUITS INCLUDING BUILT-IN TEST CIRCUITS AND METHODS

[75] Inventor: Jong-taek Kwak, Kyungki-do, Rep. of Korea

[73] Assignee: Samsung Electronic Co., Ltd., Rep. of Korea

[21] Appl. No.: 09/059,754

[22] Filed: Apr. 14, 1998

[30] Foreign Application Priority Data

Jun. 23, 1997 [KR] Rep. of Korea ............ 97-26470

[51] Int. Cl.[7] .................. G01R 31/28; G11C 29/00
[52] U.S. Cl. ............... 714/733; 714/718; 365/189.02; 365/201
[58] Field of Search ................ 714/718–723, 714/725–773, 733, 734; 365/189.02, 189.07, 201, 230.02

[56] References Cited

U.S. PATENT DOCUMENTS

| | | | |
|---|---|---|---|
| 5,535,164 | 7/1996 | Adams et al. | 365/201 |
| 5,568,437 | 10/1996 | Jamal | 365/201 |
| 5,764,655 | 6/1998 | Kirihata et al. | 714/733 |
| 5,825,783 | 10/1998 | Momohara | 714/718 |
| 5,848,016 | 12/1998 | Kwak | 365/201 |
| 5,926,420 | 7/1999 | Kim | 365/189.02 |
| 5,969,999 | 10/1999 | Lee | 365/194 |

*Primary Examiner*—Emmanuel L. Moise
*Attorney, Agent, or Firm*—Myers Bigel Sibley & Sajovec

[57] ABSTRACT

MML integrated circuits include a memory block and a logic block that is connected to the memory block. A test enable pad and a test results pad are also provided. The MML integrated circuit also includes a built-in self-tester that is responsive to a test enable signal on the test enable pad, to test the memory block and to provide the test results on the test results pad. A clock pad may also be provided wherein the built-in self-tester is responsive to the test enable signal on the test enable pad and to a clock signal on the clock pad. The built-in self-tester preferably tests the memory block by providing control signals to the memory block and obtaining data that is read from the memory block.

30 Claims, 4 Drawing Sheets

MERGED MEMORY AND LOGIC (MML) INTEGRATED CIRCUITS INCLUDING BUILT-IN TEST CIRCUITS AND METHODS

FIELD OF THE INVENTION

This invention relates to integrated circuit devices, and more particularly to testing of integrated circuit devices.

BACKGROUND OF THE INVENTION

Integrated circuit devices, such as integrated circuit memory devices and integrated circuit logic devices, are widely used in consumer and commercial applications.

Recently, merged memory and logic (MML) integrated circuits have been developed. MML integrated circuits generally include a large capacity memory and a large logic block that are merged in one integrated circuit. The large capacity memory is generally divided into a plurality of memory blocks, also referred to as "memories". The logic block may also be referred to as a "logic circuit" or simply as a "logic". Thus, an MML integrated circuit can replace discrete memory and logic chips that are used in personal computers and other consumer and commercial devices.

MML integrated circuits present new challenges for the testing thereof. In particular, the MML integrated circuit generally provides a large number of internal data pads between the memory block and the logic block. For example, up to 256 or more internal pads may be provided. Since many of these internal pads are not brought out to external MML integrated circuit pads, it may be difficult to access all of the internal data pads in order to test the memory block.

Stated differently, in order to test a conventional memory integrated circuit, test equipment is connected to the pads of the memory integrated circuit. However, the memory block in an MML integrated circuit may be difficult to test because the memory is connected to the external pads through the logic block. Accordingly, additional pads may be needed to test the memory of the MML integrated circuit. Unfortunately, the addition of large numbers of test pads may increase the cost, size and/or complexity of the MML integrated circuit.

SUMMARY OF THE INVENTION

It is therefore an object of the present invention to provide improved testing circuits and methods for MML integrated circuits.

It is another object of the present invention to provide testing methods and circuits for MML integrated circuits that can reduce the number of additional pads that are used for memory testing.

These and other objects are provided, according to the present invention, by including one or more built-in self-testers in an MML integrated circuit. By providing built-in self-testers in the MML integrated circuit, testing can be done efficiently and external access to the memory blocks need not be provided.

More specifically, MLL integrated circuits according to the invention include a memory block and a logic block that is connected to the memory block. A test enable pad and a test results pad are also provided. The MML integrated circuit also includes a built-in self-tester that is responsive to a test enable signal on the test enable pad, to test the memory block and to provide the test results on the test results pad. A clock pad may also be provided wherein the built-in self-tester is responsive to the test enable signal on the test enable pad and to a clock signal on the clock pad. The built-in self-tester preferably tests the memory block by providing control signals to the memory block and obtaining data that is read from the memory block.

The MML integrated circuit may also include a second memory block that is connected to the logic block. In one embodiment, the built-in self-tester is also responsive to the test enable signal on the test enable pad to test a second memory block. In another embodiment, a second test enable pad is provided and the built-in self-tester is responsive to a second test enable signal on the second test enable pad to test a second memory block. In another embodiment, a second test results pad is provided so that a single built-in self-tester or a second built-in self-tester tests the second memory block and provides the test results on the second test results pad. In yet another embodiment, a second built-in self-tester may be responsive to a second test enable signal on a second test enable pad and provides the results on the test results pad or on a second test results pad. The second built-in self-tester may also be responsive to the clock signal on the clock pad or to a second clock signal on the second clock pad.

Accordingly, a single built-in self-tester may be provided for multiple memory blocks or multiple built-in self-testers may be provided for multiple memory blocks. Individual or shared test enable pads, test results pads and clock pads may be provided.

MML integrated circuits may be tested according to the invention by applying a test enable signal to a built-in self-tester to activate the built-in self-tester and applying control signals from the activated built-in self-tester to the memory block. Output signals are received at the built-in self-tester from the memory block in response to the control signals. A test signal is generated in response to receipt of the output data signals by the built-in self-tester. A clock signal may also be applied to the built-in self-tester. The test enable signal and clock signal are preferably applied to the built-in self-tester from external to the MML integrated circuit and the test result signal is preferably provided external to the MML integrated circuit.

In testing the MML integrated circuit, data is written into the built-in self-tester and into the plurality of memory blocks. Data stored in the plurality of memory blocks is then read back into the built-in self-tester. Data may be sequentially written into the plurality of memory blocks and may be sequentially read back into the built-in self-tester from the plurality of memory blocks. Accordingly, efficient testing of MML integrated circuits may be provided without requiring external access to the individual memory cells.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
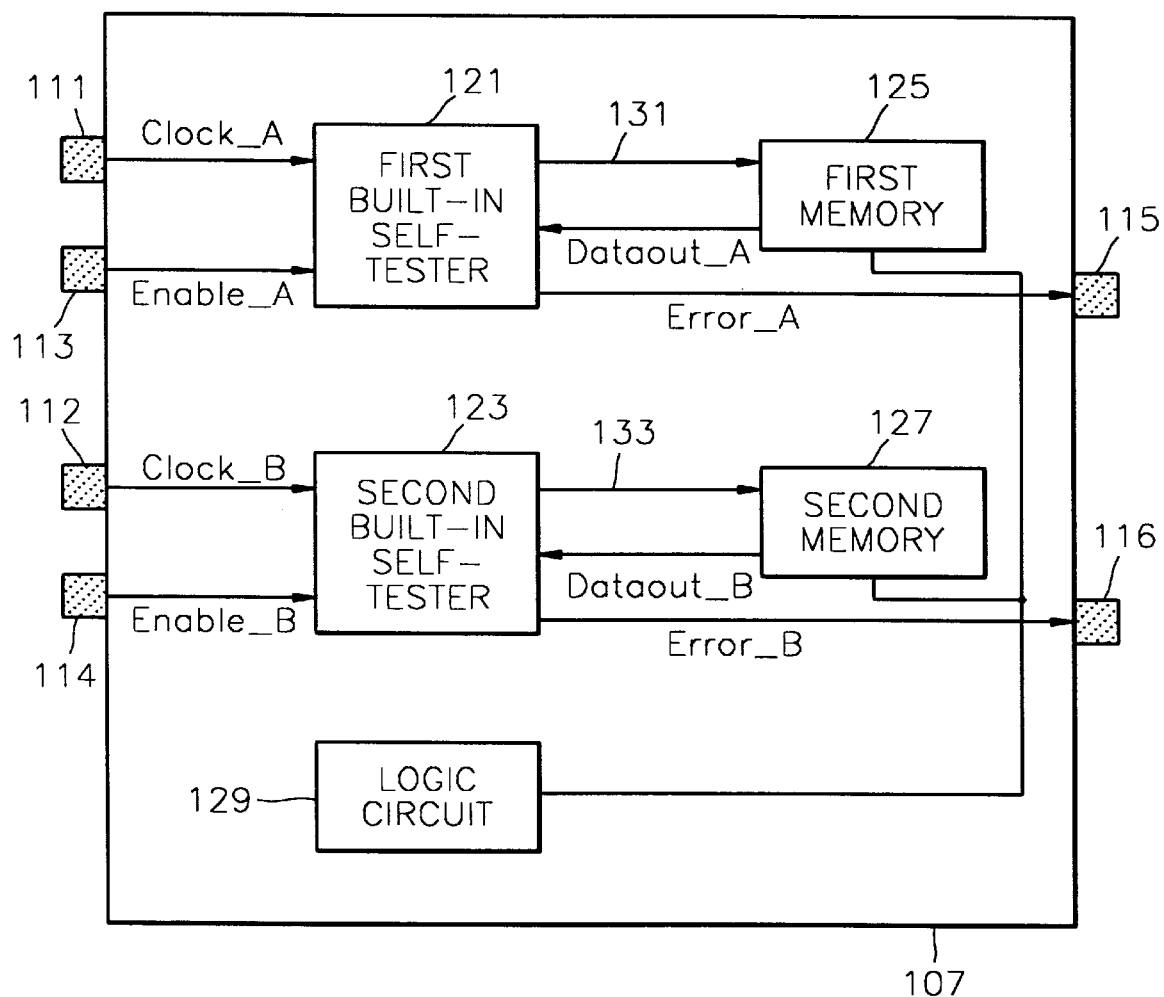
FIG. 1 is a block diagram of merged memory and logic integrated circuits according to a first embodiment of the present invention.

FIG. 1 shows a merged memory and logic (MML) integrated circuit according to a first embodiment of the present invention. Referring to FIG. 1, the MML device 107 includes first through sixth pads 111, 112, 113, 114, 115 and 116, a first built-in self-tester 121, a second built-in self-tester 123, a first memory block (also referred to as a first memory) 125, a second memory block (also referred to as a second memory) 127 and a logic (also referred to as a logic block or a logic circuit) 129. External signals are input into the MML device 107 through the first through fourth pads 111, 112, 113 and 114, and signals of the MML device are output externally through the fifth and sixth pads 115 and 116.

In detail, external first and second clock signals Clock_A and Clock_B are input into the MML device 107 through the first and second pads 111 and 112, and external first and second test enable signals Enable_A and Enable_B are input into the MML device 107 through the third and fourth pads 113 and 114. Also, first and second test result signals Error_A and Error_B of the MML device 107 are output externally through the fifth and sixth pads 115 and 116.

The first built-in self-tester 121 receives the first clock signal Clock_A and the first test enable signal Enable_A, and generates first control signals 131, i.e., a row address strobe signal RASB, a column address enable signal CASB, an address signal Addr, a write enable signal WEB and an input data signal Datain to apply to the first memory 125. A first output data signal Dataout_A is received from the first memory 125 to output the first test result signal Error_A to the fifth pad 115.

The second built-in self-tester 123 receives the second clock signal Clock_B and a second test enable signal Enable_B, generates second control signals 133, i.e., a row address strobe signal RASB, a column address strobe signal CASB, an address signal Addr, a write enable signal WEB and an input data signal Data_in to apply to the second memory 127. A second output data signal Dataout_B is received from the second memory 127 and thus a second test result signal Error_B is output to the sixth pad 116.

The first and second memories 125 and 127 for storing data, include input terminals connected to the first and second built-in self-testers 121 and 123, respectively, and output terminals connected to the first and second built-in self-testers 121 and 123, respectively. The first memory 125 generates first output data signals Dataout_A, responding to the first control signals 131, and the second memory 127 generates second output data signals Dataout_B, responding to the second control signal 133.

Figure 4:
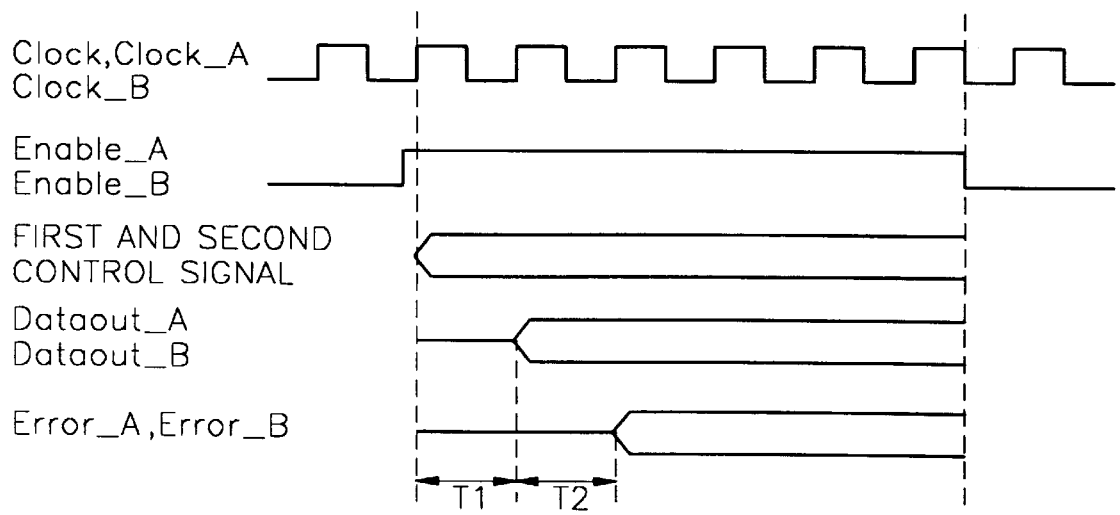
FIG. 4 is a timing diagram of signals of FIGS. 1 through 3.

The logic 129 controls the first and second memories 125 and 127. FIG. 4 is a timing diagram of signals for testing an MML device according to first through third embodiments of the present invention. Referring to FIG. 4, first clock signal Clock_A or second clock signal Clock_B and first test enable signal Enable_A or second test enable signal Enable_B are generated, and then first and second control signals 131 and 133 are generated. After a predetermined time T1, first or second output data signal dataout_A or dataout_B is generated. Then, after a predetermined time T2, first or second test result signal Testout_A or Testout_B is generated.

The operation of the merged memory logic semiconductor device 107 of FIG. 1 according to the first embodiment of the present invention will be described with reference to FIG. 4. Here, the operation of testing a first memory 125 through the first built-in self-tester 121 is similar to that of testing a second memory 127 through the second built-in self-tester 123. Accordingly, the operation of testing the first memory 125 through the first built-in self-tester 121 will be described.

When the first test enable signal Enable_A is enabled, i.e., logic high, the first built-in self-tester 121 is activated. In this state, when the first clock signal Clock_A is enabled to logic high, a first control signal 131 is generated from the first built-in self-tester 121 to apply to the first memory 125. Then, the first memory 125 generates the first output data signal Dataout_A after a predetermined time T1 as shown in FIG. 4, in response to the first control signal 131 to apply to the first built-in self-tester 121. The predetermined time T1 of FIG. 4 is a period for activating and operating the first memory 125 as soon as the first control signals 131 are input, and outputting the result as the first output data signal Dataout_A. The first built-in self-tester 121 analyzes the first output data signal Dataout_A and generates the result as the first test result signal Error_A to transmit to the fifth pad 115. The first built-in self-tester 121 requires a time T2 as shown in FIG. 4 to analyze the first output data Dataout_A and outputting the first test result signal Error_A. The first test result signal Error_A determines whether the function of the first memory 125 is normal or not.

When the number of memories increases in the semiconductor device 107 of FIG. 1, the number of built-in self-testers, clock signals and/or test enable signals can increase to be equal to that of the memories.

When the first and second test enable signals Enable_A and Enable_B are simultaneously enabled, the first and second memories 125 and 127 are simultaneously tested. Accordingly, the period for testing the first and second memories 125 and 127 can be equal to that for testing one memory. Also, conventional pads are used in common without the first through sixth pads 111, 112, 113, 114, 115 and 116, to reduce the number of pads and manufacturing cost.

Figure 2:
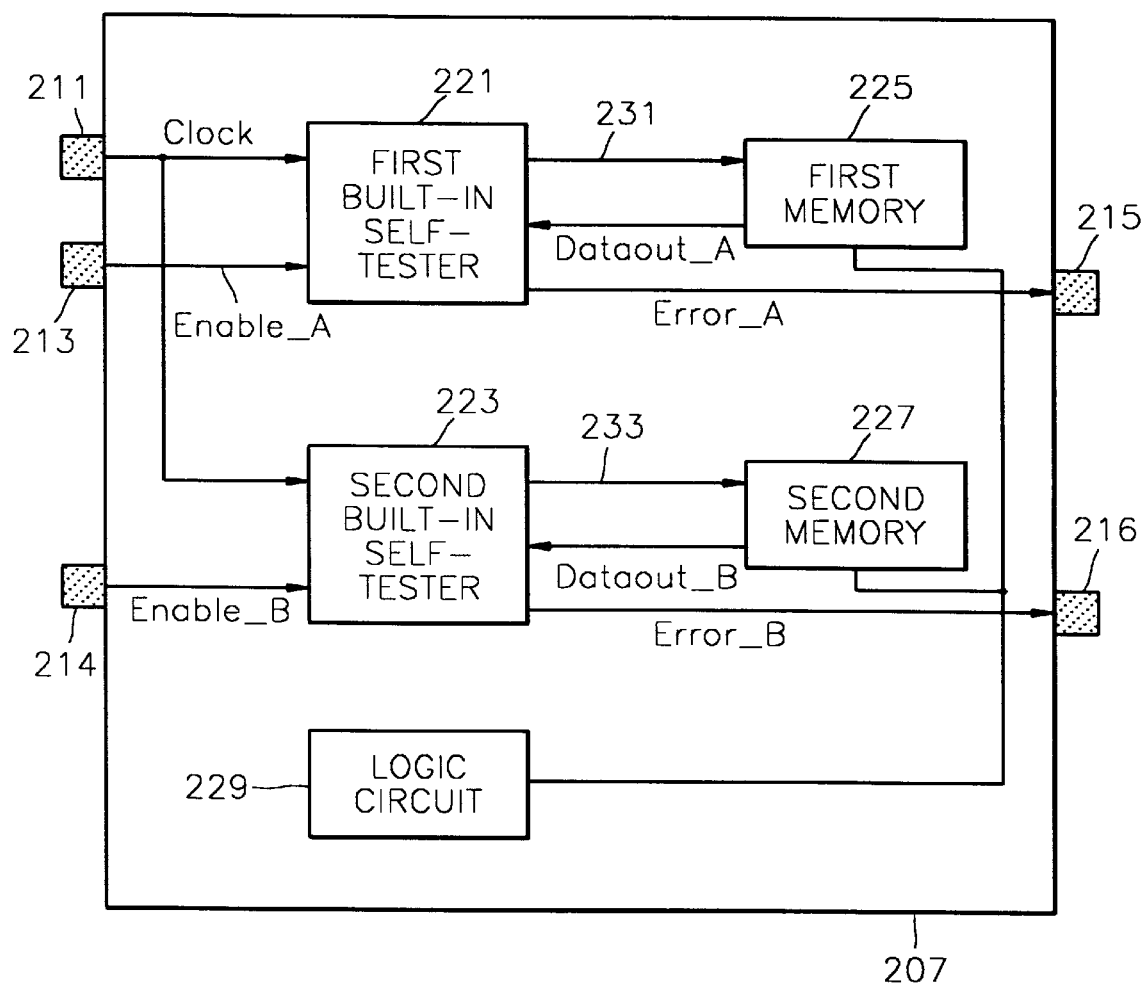
FIG. 2 is a block diagram of merged memory and logic integrated circuits according to a second embodiment of the present invention.

FIG. 2 shows an MML device 207 according to a second embodiment of the present invention. The MML device 207 includes first through fifth pads 211, 213, 214, 215 and 216, first and second built-in self-testers 221 and 223, first and second memories 225 and 227, and a logic 229. External signals are input to the MML device 207 through the first to third pads 211, 213 and 214, and signals of the merged memory logic semiconductor device 207 are output externally through the fourth and fifth pads 215 and 216.

In detail, an external clock signal Clock is input to the merged memory logic semiconductor device 207 through the first pad 211, and external first and second test enable signals Enable_A and Enable_B are input to the merged memory logic semiconductor device 207 through the second and third pads 213 and 214. Also, the first and second test result signals Error_A and Error_B of the merged memory logic semiconductor device 207 are output externally through the fourth and fifth pads 215 and 216.

The first built-in self-tester 221 receives the clock signal Clock and the first test enable signal Enable_A and generates a first control signals 231, i.e., a row address strobe signal RASB, a column address strobe signal CASB, an address signal Addr, a write enable signal WEB and an input data signal Datain to apply to the first memory 225. Also, the first output data signal Dataout_A is received from the first memory 225 to output the first test result signal Error_A to the fourth pad 215.

The second built-in self-tester 223 receives the clock signal Clock and the second test enable signal Enable_B, and generates second control signals, i.e., a row address strobe signal RASB, a column address strobe signal CASB, an address signal Addr, a write enable signal WEB and an input data signal Data_in to apply to the second memory 227. The second output data signal Dataout_B is received from the second memory 227 to output the second test result signal Error_B to the fifth pad 216.

The first and second memories 225 and 227 for storing data include input terminals connected to the first and second built-in self-testers 221 and 223, respectively, and output terminals connected to the first and second built-in self-testers 221 and 223, respectively. The first memory 225 generates the first output data signal Dataout_A, responding to the first control signals 231, and generates the second output data signal Dataout_B , in response to the second control signals 233. The logic 229 controls the first and second memories 225 and 227.

The operation of the MML device 207 of FIG. 2 according to the second embodiment of the present invention will be described with reference to FIG. 4. In the MML device 207 of FIG. 2, operation of testing the first memory 225 through the first built-in self-tester 221 is similar to that of testing the second memory 227 through the second built-in self-tester 223. Here, the operation of testing the first memory 225 through the first built-in self-tester 221 will be described.

When the first test enable signal Enable_A is enabled, i.e., logic high, the first built-in self-tester 221 is activated. In this state, when the clock signal Clock is enabled to logic high, the first control signals 231 are generated from the first built-in self-tester 221 to apply to the first memory 225. Then, the first memory 225 generates the first output data signal Dataout_A after a predetermined time T1 of FIG. 4, in response to the first control signals 231 to apply to the first built-in self-tester 221. The predetermined time T1 of FIG. 4 is a period for activating and operating the first memory 225 as soon as the first control signals 231 are input, and outputting the result as the first output data signal Dataout_A. The first built-in self-tester 221 analyzes the first output data signal Dataout_A and generates the result as the first test result signal Error_A to transmit to the fourth pad 215. The period for generating the first test result signal Error_A after generating the output data signal Dataout_A is T2 of FIG. 4. The first test result signal Error_A determines whether the function of the first memory 225 is normal or not.

When the number of memories increases in the semiconductor device 207 of FIG. 2, the number of built-in self-testers and the test enable signals can increase to be equal to that of the memories. However, one clock signal is preferably used in common.

When the first and second test enable signals Enable_A and Enable_B are simultaneously enabled, the first and second memories 225 and 227 are simultaneously tested. Accordingly, in the case that the first and second test enable signals Enable_A and Enable_B are simultaneously enabled, the period for testing the first and second memories 225 and 227 can be equal to that for testing one memory, which reduces the test time. Also, conventional pads are used in common without addition of the first through fifth pads 211, 213, 214, 215 and 216, to thereby reduce the number of pads and the fabricating cost.

Figure 3:
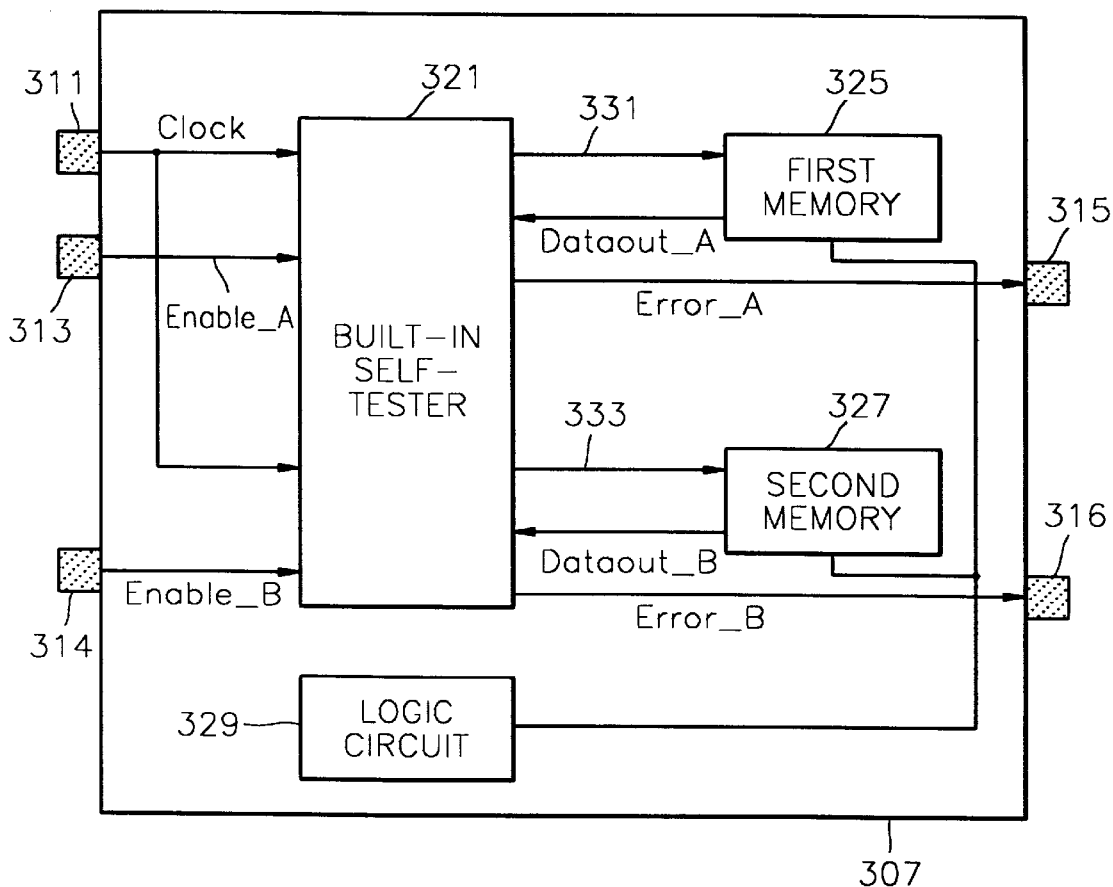
FIG. 3 is a block diagram of merged memory and logic integrated circuits according to a third embodiment of the present invention.

FIG. 3 shows an MML device 307 according to a third embodiment of the present invention. The MML device 307 includes first through fifth pads 311, 313, 314, 315 and 316, a built-in self-tester 321, first and second memories 325 and 327 and a logic 329.

External signals are input to the MML device 307 through the first through third pads 311, 313 and 314 and signals of the MML device 307 are output externally through the fourth and fifth pads 315 and 316.

In detail, external clock signal Clock is input to the MML device 307 through the first pad 211, and external first and second test enable signals Enable_A and Enable_B are input to the MML device 307 through the second and third pads 313 and 314. Also, the first and second test result signals Error_A and Error_B of the merged memory logic semiconductor device 307 are output externally through the fourth and fifth pads 315 and 316.

The built-in self-tester 321 receives the clock signal Clock, and the first and second test enable signals Enable_A and Enable_B, and generates first and second control signals 331 and 333, i.e., a row address strobe signal RASB, a column address strobe signal CASB, an address signal Addr, a write enable signal WEB and an input data signal Datain to apply to the first and second memories 325 and 327. The first output data signal Dataout_A and Dataout_B are received from the first and second memories 325 and 327 to output first and second test result signals Error_A and Error_B to the fourth and fifth pads 315 and 316. The second control signals 333 may commonly use the first control signal 331.

The first and second memories 325 and 327 for storing data include input terminals commonly connected to the built-in self-tester 321, and output terminals connected in common to the built-in self-tester 321. The first memory 325 generates the first output data signal Dataout_A, in response to the control signals 331, and the second memory 327 generates the second output data Dataout_B, in response to the second control signals 333. The logic 329 controls the first and second memories 325 and 327.

The operation of the MML device 307 according to the third embodiment of the present invention of FIG. 3 will be described with reference to FIG. 4.

When the first test enable signal Enable_A is enabled, i.e., logic high, the built-in self-tester 321 is activated. In this state, when the clock signal Clock is enabled to logic high, the first control signals 331 are generated from the built-in self-tester 321 to apply to the first memory 325. Then, the first memory 325 generates the first output data Dataout_A after a predetermined time T1 of FIG. 4, in response to the first control signals 331 to apply to the built-in self-tester 321. The predetermined time T1 of FIG. 12 is a period for activating and operating the first memory 325 as soon as the first control signals 331 are input, and outputting the result as the first output data signal Dataout_A. The built-in self-tester 321 analyzes the first output data signal Dataout_A and generates the result as the first test result signal Error_A to transmit to the fourth pad 315. T2 of FIG. 4 is required for generating the first test result signal Error_A after generating the output data signal Dataout_A. The first test result signal Error_A determines whether the function of the first memory 325 is normal or not.

The operation of testing the function of the second memory 327 is similar to that of testing the first memory 325. Here, the clock signal Clock and the built-in self-tester 321 are used in common for the operation of testing the function of the second memory 327. Accordingly, when the first and second test enable signals Enable_A and Enable_B are simultaneously enabled, the first and second memories 325 and 327 are simultaneously tested. Therefore, the period of testing the first and second memories 325 and 327 is equal to that of testing one memory, which reduces the testing time. Also, conventional pads are used in common without the addition of first through fifth pads 311, 313, 314, 315 and 316, to thereby reduce the number of pads and the fabricating cost.

When the number of the memories increases in the semiconductor device of FIG. 3, the number of test enable signals can increase to match the number of the memories. However, one built-in self-tester and one clock signal are used in common.

Figure 5:
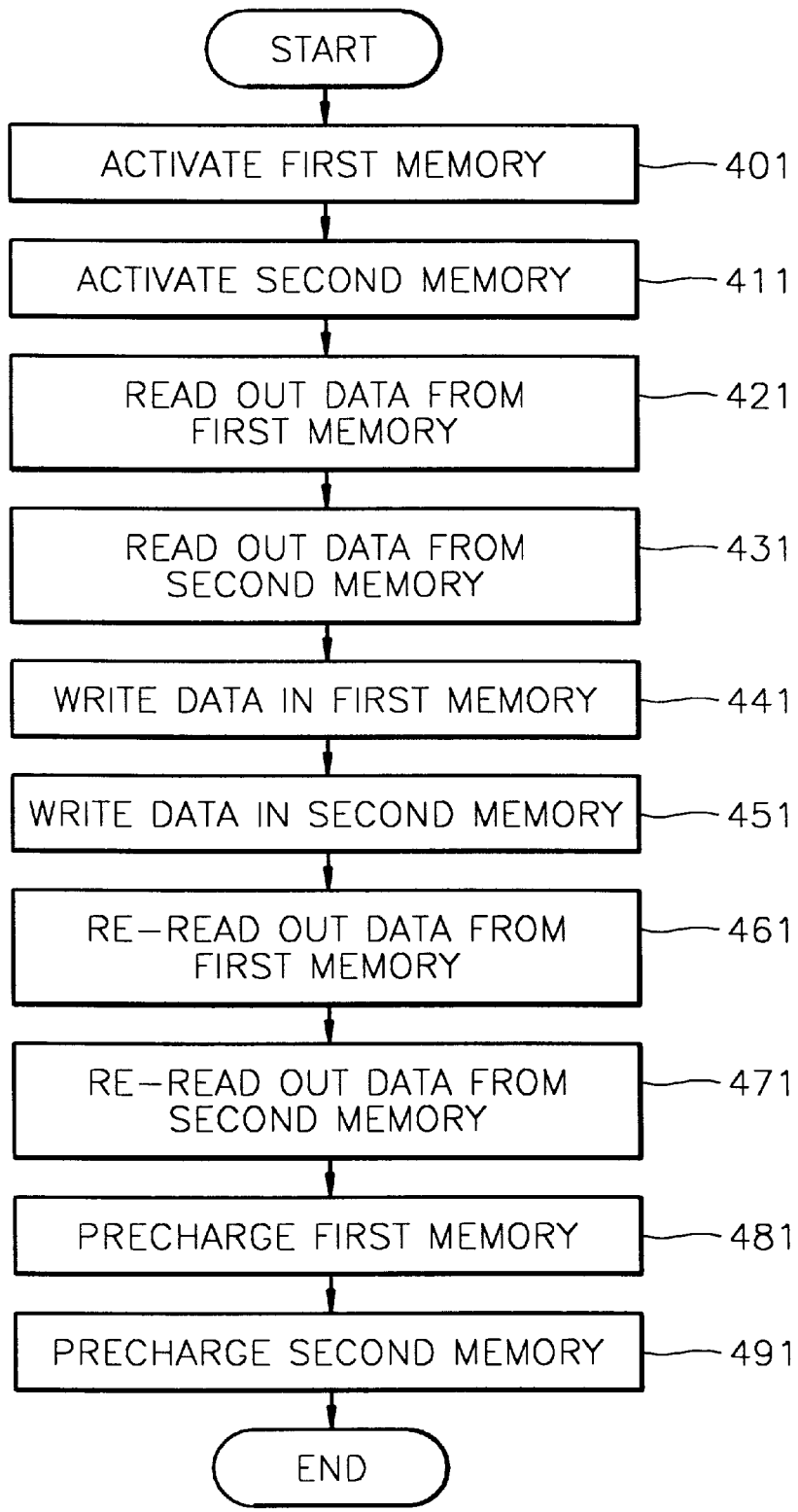
FIG. 5 is a flowchart showing memory test methods for merged memory and logic integrated circuits according to the present invention.

FIG. 5 is a flowchart of test methods for MML devices according to the present invention. Referring to FIG. 5, a test method of a memory of the MML device 307 of FIG. 3 includes the steps of activating a first memory (401), activating a second memory (411), reading data from the first memory (421), reading data from the second memory (431), writing data in the first memory (441), writing data in the second memory (451), re-reading data from the first memory (461), re-reading out data from the second memory (471), precharging the first memory (481) and precharging the second memory (491).

In the step of activating the first memory (401), the built-in self-tester 321 is activated by external signals, and the built-in self-tester 321 activates the first memory 325. In the step of activating the second memory (411), the built-in self-tester 321 activates the second memory 327. In the step of reading data from the first memory (421), the built-in self-tester 321 reads data stored in the first memory 325. In the step of reading data from the second memory (431), the built-in self-tester 321 reads data stored in the second memory 327.

In the step of writing data in the first memory (441), the built-in self-tester 321 writes data of '1' or '0' in the first memory 325. In the step of writing data in the second memory (451), the built-in self-tester 321 writes data of '1' or '0' in the second memory 327.

In the step of re-reading data from the first memory (461), the built-in self-tester 321 reads data written in the first memory 325. Reference data during normal first memory 325, is stored in the built-in self-tester 321. Accordingly, in the built-in self-tester 321, the data read from the first memory 325 is compared to the reference data, and if the read data is different from the reference data, an error signal is generated and transmitted externally.

In the step of re-reading out data from the second memory 327 (471), the built-in self-tester 321 reads data written in the second memory 327. In the built-in self-tester 321, the data read from the second memory 327 is compared to the reference data, and if the read data is different from the reference data, an error signal is generated and transmitted externally.

In the step of precharging the first memory (481), which is a pre-step for writing data in the first memory 325 or reading data stored in the first memory 325, the first memory 325 is precharged. In the step of precharging the second memory 327 (491), which is a pre-step for writing data in the second memory 327 or reading data stored in the second memory 327, the second memory 327 is precharged.

By the test methods of the present invention, tests on the first and second memories 325 and 327 can be performed in an interleaved manner. When the first and second memories 325 and 327 are 16M synchronous memories, a test cycle of the first and second memories 325 and 327 using 14N Y-March algorithm is expressed by a following Formula 1. It is assumed that a data bus transmits 64bits:

(Formula 1)

Test cycle=data format×stage×128K

=2×6×128K

=1,572,864 (cycle time)

Eleven clocks of Table 1 are used for simultaneously performing each stage with respect to the first and second memories 325 and 327 in an interleaved manner.

TABLE 1

| | 1 | 2 | 3 | 4 | 5 | 6 | 7 | 8 | 9 | 10 | 11 |
|---|---|---|---|---|---|---|---|---|---|---|---|
| 1st memory | active | stand-by | stand-by | stand-by | read | stand-by | write | stand-by | re-read | pre-charge | stand-by |
| 2nd memory | stand-by | stand-by | active | stand-by | stand-by | read | stand-by | read | stand-by | read | pre-charge |
| input data | | | | | | | 1st data input | 2nd data input | | | |
| output data | | | | | | | 1st data output | 2nd data output | | | |

Accordingly, the total test time on the first and second memories 325 and 327 is expressed by the following Formula 2:

(Formula 2)

Test time=1,572,864×11

=325,301,504(cycle time)

The test time of Formula 2 according to the present invention is approximately 55% of the conventional test time. Thus, the memory test time according to the present invention is reduced to approximately 45% of the conventional memory test time. Interleaving methods according to the present invention may be applied to MML devices having three or more memories, to thereby greatly reduce the memory test time.

According to the present invention, an internal memory can be tested using conventional pads without requiring added pads. Also, the time for testing the memories can be greatly reduced regardless of the number of memories.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A merged memory and logic (MML) integrated circuit including external pads, the MML integrated circuit comprising:
   a memory block that is not directly connected to the external pads of the MML integrated circuit;
   a logic block that is connected to the memory block within the MML integrated circuit and that is directly connected to the external pads of the MML integrated circuit, such that the memory block is connected to the external pads of the MML integrated circuit through the logic block;
   a test enable pad;
   a test results pad; and
   a built-in self-tester that is separate from the logic block and that is responsive to a test enable signal on the test enable pad, to test the memory block and to provide the test results on the test results pad.

2. An MML integrated circuit according to claim 1 further comprising a clock pad, and wherein the built-in self-tester is responsive to the test enable signal on the test enable pad and to a clock signal on the clock pad, to test the memory block and to provide the test results on the test results pad.

3. An MML integrated circuit according to claim 1 wherein the built-in self-tester tests the memory block by providing control signals to the memory block and obtaining data that is read from the memory block.

4. An MML integrated circuit according to claim 1 further comprising a second memory block that is connected to the logic block, the built-in self-tester being responsive to the test enable signal on the test enable pad, to test the second memory block and to provide the test results on the test results pad.

5. An MML integrated circuit according to claim 1 further comprising a second memory block that is connected to the logic block, and a second test enable pad, the built-in self-tester being responsive to a second test enable signal on the second test enable pad, to test the second memory block and to provide the test results on the test results pad.

6. An MML integrated circuit according to claim 1 further comprising a second memory block that is connected to the logic block, a second test enable pad and a second test results pad, the built-in self-tester being responsive to a second test enable signal on the second test enable pad, to test the second memory block and to provide the test results on the second test results pad.

7. An MML integrated circuit according to claim 1 further comprising a second memory block that is connected to the logic block, and a second built-in self-tester, the second built-in self-tester being responsive to the test enable signal on the test enable pad, to test the second memory block and to provide the test results on the test results pad.

8. An MML integrated circuit according to claim 1 further comprising a second memory block that is connected to the logic block, a second built-in self-tester and a second test enable pad, the second built-in self-tester being responsive to a second test enable signal on the second test enable pad, to test the second memory block and to provide the test results on the test results pad.

9. An MML integrated circuit according to claim 1 further comprising a second memory block that is connected to the logic block, a second built-in self-tester, a second test enable pad and a second test results pad, the second built-in self-tester being responsive to a second test enable signal on the second test enable pad, to test the second memory block and to provide the test results on the second test results pad.

10. An MML integrated circuit according to claim 5 further comprising a clock pad, and wherein the built-in self-tester is also responsive to a clock signal on the clock pad.

11. An MML integrated circuit according to claim 6 further comprising first and second clock pads, and wherein the built-in self-tester is also responsive to clock signals on the respective first and second clock pads.

12. An MML integrated circuit according to claim 7 further comprising a clock pad, and wherein the built-in self-tester and the second built-in self-tester are also responsive to a clock signal on the clock pad.

13. An MML integrated circuit according to claim 7 further comprising first and second clock pads, and wherein the built-in self-tester and the second built-in self-tester are also responsive to clock signals on the respective first and second clock pads.

14. An MML integrated circuit according to claim 8 further comprising a clock pad, and wherein the built-in self-tester and the second built-in self-tester are also responsive to a clock signal on the clock pad.

15. An MML integrated circuit according to claim 8 further comprising first and second clock pads, and wherein the built-in self-tester and the second built-in self-tester are also responsive to clock signals on the respective first and second clock pads.

16. An MML integrated circuit according to claim 9 further comprising a clock pad, and wherein the built-in self-tester and the second built-in self-tester are also responsive to a clock signal on the clock pad.

17. An MML integrated circuit according to claim 9 further comprising first and second clock pads, and wherein the built-in self-tester and the second built-in self-tester are also responsive to clock signals on the respective first and second clock pads.

18. A merged memory and logic (MML) integrated circuit including external pads, the MML integrated circuit comprising:
   a plurality of memory blocks that are not directly connected to the external pads of the MML integrated circuit;
   a logic block that is connected to the plurality of memory blocks within the MML integrated circuit and that is directly connected to the external pads of the MML integrated circuit, such that the plurality of memory block are connected to the external pads of the MML integrated circuit through the logic block; and
   a corresponding plurality of built-in self-testers that are separate from the logic block, a respective one of which is connected to a respective one of the memory blocks, to test the respective memory block and to provide the test results external to the MML integrated circuit.

19. An MML integrated circuit according to claim 18 further comprising at least one test enable pad, the plurality of built-in self-testers being responsive to at least one test enable signal on the at least one test enable pad, to test the respective memory block.

20. An MML integrated circuit according to claim 18 further comprising at least one test results pad, the plurality of built-in self-testers providing the test results on the at least one test results pad.

21. An MML integrated circuit according to claim 18 further comprising at least one clock pad, the plurality of built-in self-testers being responsive to at least one clock signal on the at least one clock pad, to test the respective memory block.

22. A method of testing a merged memory and logic (MML) integrated circuit including external pads, a memory block that is not directly connected to the external pads of the MML integrated circuit, a logic block that is connected to the memory block within the MML integrated circuit and that is directly connected to the external pads of the MML integrated circuit, such that the memory block is connected to the external pads of the MML integrated circuit through the logic block, and a built-in self-tester that is separate from the logic block and that is connected to the memory block, the method comprising the steps of:

applying a test enable signal to the built-in self-tester to activate the built-in self tester;

applying control signals from the activated built-in self-tester to the memory block;

receiving output data signals at the built-in self-tester from the memory block in response to the control signals; and generating a test result signal in response to receipt of the output data signals by the built-in self-tester.

23. A method according to claim 22 further comprising the step of applying a clock signal to the built-in self-tester.

24. A method according to claim 22 wherein the test enable signal and the clock signal are applied to the built-in self-tester from external of the MML integrated circuit.

25. A method according to claim 22 wherein the generating step is followed by the step of providing the test result signal external to the MML integrated circuit.

26. A method of testing a merged memory and logic (MML) integrated circuit including external pads, a plurality of memory blocks that are not directly connected to the external pads of the MML integrated circuit, a logic block that is connected to the plurality of memory blocks within the MML integrated circuit and that is directly connected to the external pads of the MML integrated circuit, such that the plurality of memory block are connected to the external pads of the MML integrated circuit through the logic block, and a built-in self-tester that is separate from the logic block and that is connected to the plurality of memory blocks, the method comprising the steps of:

writing data into the built-in self tester and into the plurality of memory blocks;

reading the data stored in the plurality of memory blocks back into the built-in self-tester; and generating a test result signal in response to reading the data stored in the plurality of memory blocks back into the built-in-self-tester.

27. A method according to claim 26 wherein the writing step comprises the steps of:

activating the plurality of memory blocks;

reading data stored in the plurality of memory blocks by the built-in self-tester; and writing data in the plurality of memory blocks by the built-in self-tester.

28. A method according to claim 26 wherein the reading step is followed by the step of:

precharging the plurality of memory blocks.

29. A method according to claim 26 wherein the writing step comprises the step of:

sequentially writing data into the plurality of memory blocks.

30. A method according to claim 26 wherein the reading step comprises the step of:

sequentially reading the data stored in the plurality of memory blocks back into the built-in self-tester.

\* \* \* \* \*

UNITED STATES PATENT AND TRADEMARK OFFICE
CERTIFICATE OF CORRECTION

PATENT NO. : 6,158,036
DATED : December 5, 2000
INVENTOR(S) : Jong-taek Kwak

It is certified that error appears in the above-identified patent and that said Letters Patent is hereby corrected as shown below:

[56] References Cited

U.S. PATENT DOCUMENTS
5,535,165        7/1996         Davis et al..............365/201

FOREIGN PATENT DOCUMENTS
0 801 400 A1     10/1997        Europe
0 801 400 A1     10/1997        Europe
WO 989/12707     03/1998        PCT OTHER PUBLICATIONS
Search Report, The Patent Office, GB 9810262.7, 16 November 1998

Signed and Sealed this

Tenth Day of July, 2001

*Nicholas P. Godici*

Attest:

NICHOLAS P. GODICI
Attesting Officer   Acting Director of the United States Patent and Trademark Office